United States Patent
Kim

(10) Patent No.: US 10,123,105 B2
(45) Date of Patent: Nov. 6, 2018

(54) AUTOMATIC REWINDING APPARATUS INCLUDING ABRASION-RESISTANT ROTATION AXIS

(71) Applicant: BLUECOM Co., Ltd., Incheon (KR)

(72) Inventor: Beom-Seok Kim, Incheon (KR)

(73) Assignee: BLUECOM CO., LTD., Incheon (KR)

( * ) Notice: Subject to any disclaimer, the term of this patent is extended or adjusted under 35 U.S.C. 154(b) by 0 days.

(21) Appl. No.: 15/691,015

(22) Filed: Aug. 30, 2017

(65) Prior Publication Data
US 2018/0063623 A1 Mar. 1, 2018

(30) Foreign Application Priority Data
Aug. 31, 2016 (KR) ................... 10-2016-0112121

(51) Int. Cl.
| | | |
|---|---|---|
| H04R 1/10 | (2006.01) | |
| B65H 75/40 | (2006.01) | |
| H02G 11/02 | (2006.01) | |
| H05K 5/00 | (2006.01) | |
| H05K 5/02 | (2006.01) | |
| H05K 1/02 | (2006.01) | |

(52) U.S. Cl.
CPC ......... *H04R 1/1033* (2013.01); *B65H 75/406* (2013.01); *H02G 11/02* (2013.01); *H05K 1/0257* (2013.01); *H05K 5/0069* (2013.01); *H05K 5/0247* (2013.01); *H05K 2201/09063* (2013.01)

(58) Field of Classification Search
None
See application file for complete search history.

(56) References Cited

U.S. PATENT DOCUMENTS

| | | | | |
|---|---|---|---|---|
| 9,351,881 | B2 * | 5/2016 | Crawford | A61F 9/029 |
| 9,723,395 | B2 * | 8/2017 | Kim | H04R 5/0335 |
| 2004/0218770 | A1 * | 11/2004 | Chang | H04M 1/15 |
| | | | | 381/309 |
| 2004/0256188 | A1 * | 12/2004 | Harcourt | B65H 75/4428 |
| | | | | 191/12.2 A |

(Continued)

FOREIGN PATENT DOCUMENTS

| | | |
|---|---|---|
| KR | 101471903 | 12/2014 |
| KR | 101471904 | 12/2014 |

*Primary Examiner* — Xanthia C Cunningham
(74) *Attorney, Agent, or Firm* — IP & T Groul LLP

(57) ABSTRACT

An automatic rewinding apparatus with an abrasion-resistant rotation axis includes: a main base lower housing including a cylindrical fixing axis at a center; a PCB substrate penetrated by the fixing axis and combined with the main base lower housing; a contact terminal coupling plate; a middle base coil housing including: a sub-base lower housing, a cylindrical winding bobbin, a sub-base upper housing, and an abrasion-resistance improving insert disposed on internal circumferential surfaces of punctured centers of the sub-base lower housing, the winding bobbin and the sub-base upper housing; a rolling elastic member with elasticity; grease cover plates on both sides of the rolling elastic member; a cap for covering the opening of the sub-base upper housing and combination with the sub-base upper housing; a stopper ball; and a main base upper housing combined with the main base lower housing and covering a second side where the track of the cap.

4 Claims, 8 Drawing Sheets

(56) References Cited

U.S. PATENT DOCUMENTS

| | | | |
|---|---|---|---|
| 2011/0233078 A1* | 9/2011 | Monaco | A45C 11/00 206/223 |
| 2013/0083456 A1* | 4/2013 | Koenig | H04R 1/1033 361/679.01 |
| 2013/0208937 A1* | 8/2013 | Stern | H04M 1/04 381/332 |
| 2016/0366506 A1* | 12/2016 | Kim | H04R 5/0335 |

* cited by examiner

AUTOMATIC REWINDING APPARATUS INCLUDING ABRASION-RESISTANT ROTATION AXIS

CROSS-REFERENCE TO RELATED APPLICATIONS

The present application claims priority of Korean Patent Application No. 10-2016-0112121, filed on Aug. 31, 2016, which is incorporated herein by reference in its entirety.

BACKGROUND

1. Field

Exemplary embodiments of the present invention relate to an automatic rewinding apparatus, and more particularly, to an automatic rewinding apparatus that may maintain a rotation axis firmly without distortion even though the automatic rewinding apparatus is used for a long time so that the automatic rewinding apparatus may prevent disconnection between a terminal end and a Printed Circuit Board (PCB) pattern and prevent a short-circuit from occurring.

2. Description of the Related Art

Due to recent advancement in science technologies, listening to music or watching videos through an MP3 (MPEG-1 Audio Layer 3) player, a smart phone, and/or a tablet PC have been brought to our daily life, and ear phones are frequently used to listen to music or watch videos with no regard to the place while practicing good etiquette in public places.

An ear phone generally includes an ear phone output unit that outputs sound and an ear phone wire that connects an ear phone output unit to a device and supplies a signal output generated in the device to the ear phone output unit.

The ear phone wire is generally manufactured long enough that a user may use the ear phone without inconvenience. For this reason, when the user does not use the ear phone, the ear phone wire may be tangled and twisted and when the ear phone is used next time, the user has to untangle the ear phone wire, which is inconvenient and bothersome.

To solve the problem, an instrument like a reel may be used to wind up the ear phone wire and unwind the ear phone wire from the reel instrument.

However, the method of winding up the ear phone wire in the instrument is inconvenient in that the ear phone wire has to be wound up in the instrument several rounds, and conversely, when the ear phone is to be used, the ear phone wire has to be unwound from the instrument.

Also, to solve the problem, an automatic rewinding apparatus has been developed. The automatic rewinding apparatus allows an ear phone wire wound up in an instrument to be unwound as much as desired by a user when the user pulls out the ear phone wire as much as desired, and then when the user presses a switch, the ear phone wire that is pulled out is rewound back into the instrument. However, the automatic rewinding apparatus has a drawback in that a saw-toothed gear inside the automatic rewinding apparatus may bump into the switch that is engaged with the saw-toothed gear and make noise when the ear phone wire is pulled out from the automatic rewinding apparatus or when the ear phone wire that is already pulled out of the automatic rewinding apparatus is rewound back into the automatic rewinding apparatus.

To solve the problem, technologies disclosed in 'Prior Art 1', which is Korea Patent No. 10-1471903 published on Dec. 5, 2014, and 'Prior Art 2', which is Korea Patent No. 10-1471904 published on Dec. 5, 2014, are suggested.

The Prior Art 1 discloses an automatic rewinding apparatus for electronic appliances. The automatic rewinding apparatus of Prior Art 1 may include a base plate, a fixing axis that is extended from one side of the base plate in a direction perpendicular to the base plate, a wheel that is penetrated by the fixing axis and rotates based on the fixing axis, a wire one end of which is fixed to a circumferential surface of the wheel and wound up onto the circumferential surface of the wheel, an elastic member that is rolled in and has one end fixed to the fixing axis and another end fixed to a portion of the wheel, a cap that rotates along with the wheel while being integrated with the wheel and has a ball track on a surface confronting an upper case, the upper case that covers the cap and has a straight groove to be engaged with the ball, and a ball that is engaged between the ball track and the straight groove of the upper case and when the cap integrated with the wheel rotates in one direction, rotates along the ball track while being engaged in the straight groove.

The Prior Art 2 discloses an automatic rewinding apparatus for electronic appliances. The automatic rewinding apparatus of Prior Art 2 may include a base plate, a fixing axis that is extended from one side of the base plate in a direction perpendicular to the base plate, a wheel that is penetrated by the fixing axis and rotates based on the fixing axis, a wire one end of which is fixed to a circumferential surface of the wheel and wound up onto the circumferential surface of the wheel, an elastic member that is rolled in and has one end fixed to the fixing axis and another end fixed to a portion of the wheel, a cap that rotates along with the wheel while being integrated with the wheel and has a track on a surface confronting a case, the case that covers the cap, and a wire spring that is inserted between the cap and the case and bent in the shape of a circular arc with elasticity and has one end fixed to the case and the other end engaged with the track. The track may include an external track that is formed concavely in a circumferential direction of the cap, an internal track that is formed toward the inside of the radius of the external track and formed concavely in the circumferential direction of the cap, two or more straight connection tracks that connect the internal track and the external track while being bent concavely, and two or more stop connection tracks that connect the internal track and the external track while being bent concavely and are disposed between one straight connection track and the other straight connection track while being bent in a shape of '>'.

According to the automatic rewinding apparatuses of the Prior Art 1 and the Prior Art 2, the internal parts may wear down due to the rotations after being used for a long time, and the rotation axes may not be formed firmly and may be moved and deformed. As the rotation axes get out of their positions, the parts may also go out of their positions, and a terminal end and a printed circuit board (PCB) pattern may be disconnected from each other so as to cause a short-circuit, or make the ball get stuck in the track or get out of the track. As a result, the automatic rewinding apparatuses may not perform the automatic rewinding function anymore and break down frequently.

Also, when the number of ends of a terminal contacting the PCB pattern is increased, for example, when a 4-pin terminal and a PCB pattern for a 4-pin terminal are applied, more delicate rotation-oriented contact is required between the PCB pattern and the terminal end. However, in the typical automatic rewinding apparatuses including the automatic rewinding apparatuses of the Prior Art 1 and the Prior Art 2, the rotation axis of the parts may be distorted or get out of the position due to the rotation, causing a short-circuit easily, when the automatic rewinding apparatuses are used for a long time. Therefore, it is required to develop a technology for solving the problems.

SUMMARY

Embodiments of the present invention are directed to an automatic rewinding apparatus that may be able to maintain a rotation axis firmly without distortion even though the automatic rewinding apparatus is used for a long time so that the automatic rewinding apparatus may prevent disconnection between a terminal end and a Printed Circuit Board (PCB) pattern and prevent a short-circuit form occurring.

Also, the embodiments of the present invention are directed to an automatic rewinding apparatus that may be able to maintain a rotation axis firmly without distortion even though the automatic rewinding apparatus is used for a long time so that automatic rewinding function of the automatic rewinding apparatus may be prevented from malfunctioning due to a ball stuck in a track.

Also, the embodiments of the present invention are directed to an automatic rewinding apparatus that may be able to maintain a rotation axis firmly without distortion even though the automatic rewinding apparatus is used for a long time so that a 4-pin terminal and a PCB pattern for a 4-pin terminal, which require a rotation to be performed delicately and firmly, may be used stably without a short-circuit.

In accordance with an embodiment of the present invention, an automatic rewinding apparatus with an abrasion-resistant rotation axis includes: a main base lower housing that includes a cylindrical fixing axis formed at a center of a first side of the main base lower housing perpendicularly to the first side; a Printed Circuit Board (PCB) substrate that has a central portion punctured so that the PCB substrate is penetrated by the cylindrical fixing axis at a center of the PCB substrate and combined with the first side of the main base lower housing, and includes a 4-pin PCB pattern formed on a second side which is another side of the PCB substrate which is different from a first side contacting the main base lower housing; a contact terminal coupling plate that includes a 4-pin contact terminal 310 combined on a first side and has a central portion punctured so that the contact terminal coupling plate is penetrated by the cylindrical fixing axis at a center of the contact terminal coupling plate and, when the contact terminal coupling plate is combined with the cylindrical fixing axis, the 4-pin contact terminal contacts the 4-pin PCB pattern of the PCB substrate; a middle base coil housing which includes: a sub-base lower housing that is formed in a shape of a cylindrical cover having a first side open, a cylindrical winding bobbin that is formed at a center of a second side of the sub-base lower housing and has a wire wound up on an external circumferential surface of the winding bobbin, a sub-base upper housing that is formed on a second side of the winding bobbin and has a second side of the sub-base upper housing open, where the open side of the sub-base upper housing is in opposite to the open side of the sub-base lower housing, and an abrasion-resistance improving insert that is disposed on internal circumferential surfaces of punctured centers of the sub-base lower housing, the winding bobbin and the sub-base upper housing, and penetrated by and combined with the cylindrical fixing axis; a rolling elastic member that is formed to have elasticity in a rolled form and housed inside the sub-base upper housing so as to provide the middle base coil housing with a rotation force; a pair of the grease cover plates that are formed in a disk shape, have a central portion punctured so that the pair of the grease cover plates are penetrated by and combined with the cylindrical fixing axis, are combined with the cylindrical fixing axis by being respectively disposed on both sides of the rolling elastic member, and prevent a grease applied to the rolling elastic member from leaking by being housed inside the sub-base upper housing; a cap that has a first side which is formed in a cover shape to cover the opening of the sub-base upper housing and to be combined with the sub-base upper housing, and a second side where a track for moving a stopper ball is formed; a stopper ball that is positioned on the track and moves along the track; and a main base upper housing that is formed to be combined with the main base lower housing and to entirely cover a second side where the track of the cap is formed when the main base upper housing is combined with the main base lower housing.

The main base lower housing may include a plurality of combining grooves that are disposed in a radial shape on an outskirt of the first side.

The main base upper housing may include a plurality of combining protrusions that are disposed in a radial shape on an outskirt of a first side.

The abrasion-resistance improving insert is formed of a metal.

DETAILED DESCRIPTION

Figure 1:
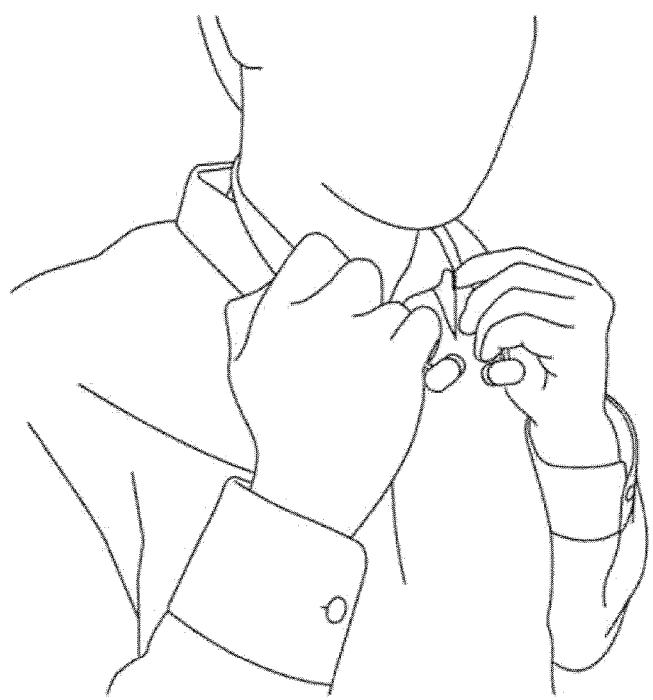
FIGS. 1 and 2 illustrate a usage example of a Bluetooth neck band-type ear phone to which an embodiment of the present invention is applied.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Such terms as 'a first' and 'a second' may be used to describe diverse constituent elements, but the scope of the constituent elements may not be limited by those terms. The terms may be used only to distinguish one constituent element from other constituent elements.

The terms used in this patent specification may be used to describe only a particular embodiment of the present invention, and should not be construed to limit the scope of the present invention. Also, a singular expression may include plural unless it is described otherwise in the context.

In this specification, the terms 'include' and 'have' may be understood to describe the presence of a feature, number, step, operation, constituent element, part, or a combination thereof and they may not exclude the possibility of addition.

Hereafter, the embodiments of the present invention may be described in detail with reference to the accompanying drawings.

Figure 2:
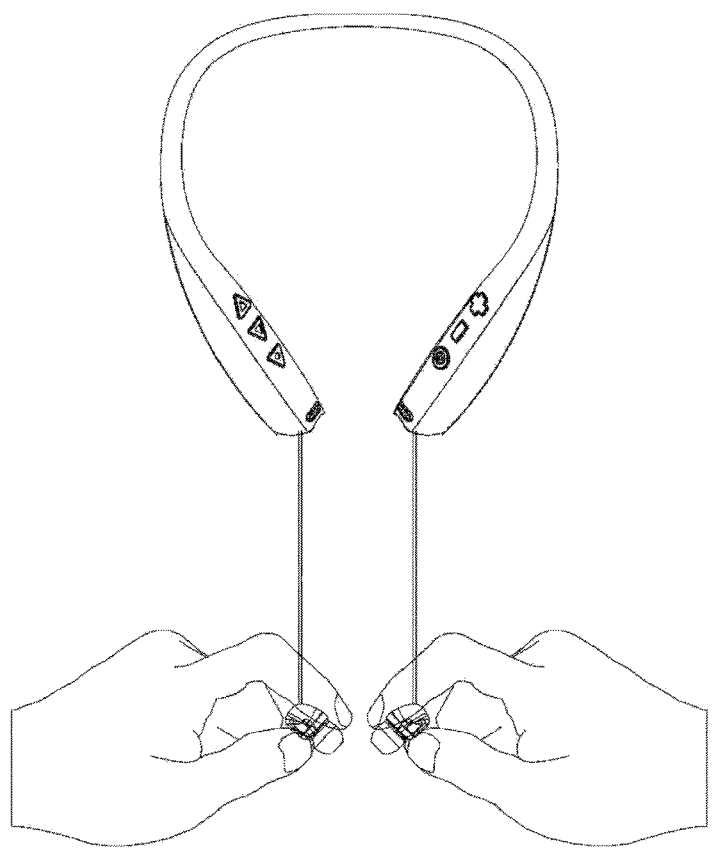
Figure 3:
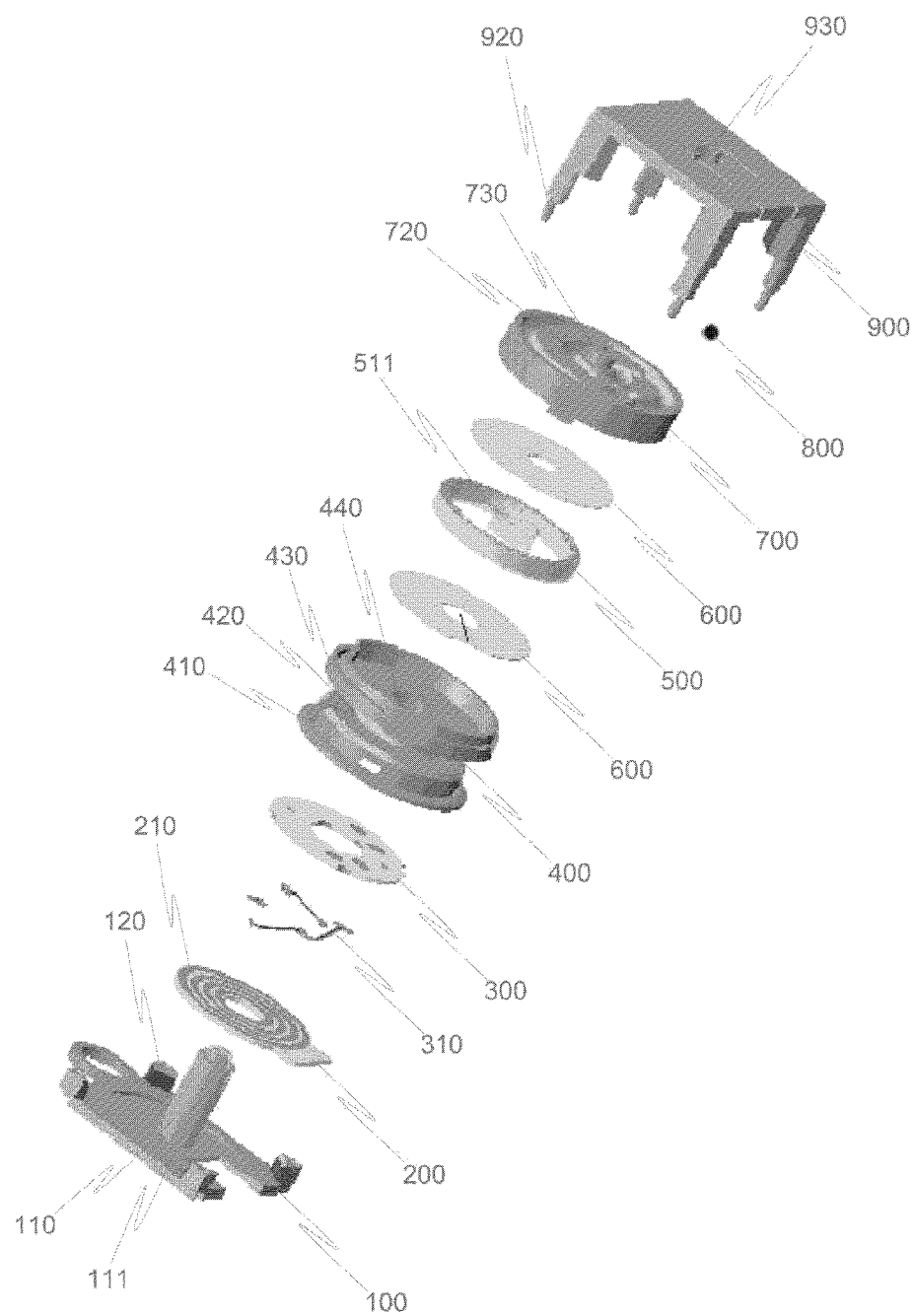
FIG. 3 is a disassembled perspective view of an automatic rewinding apparatus in accordance with an embodiment of the present invention.
Figure 4:
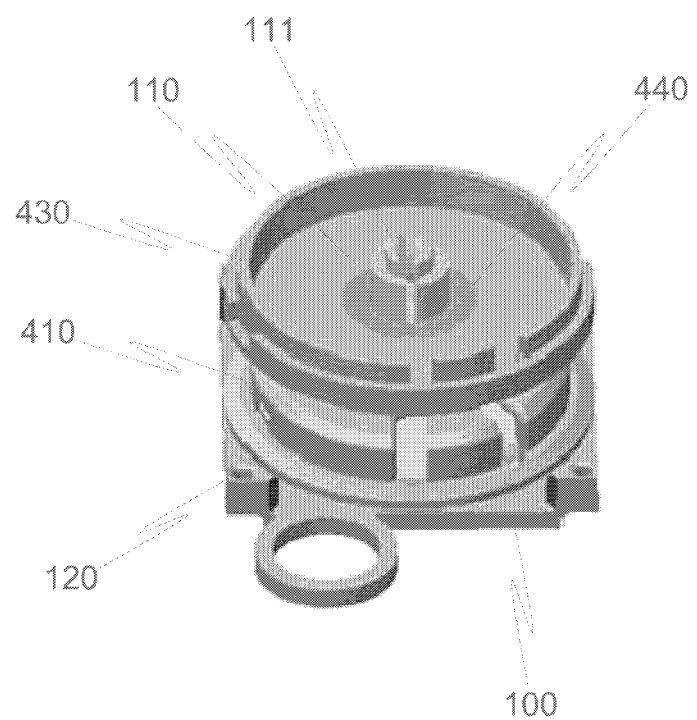
FIG. 4 is an assembled perspective view of a part of the automatic rewinding apparatus in accordance with the embodiment of the present invention.
Figure 5:
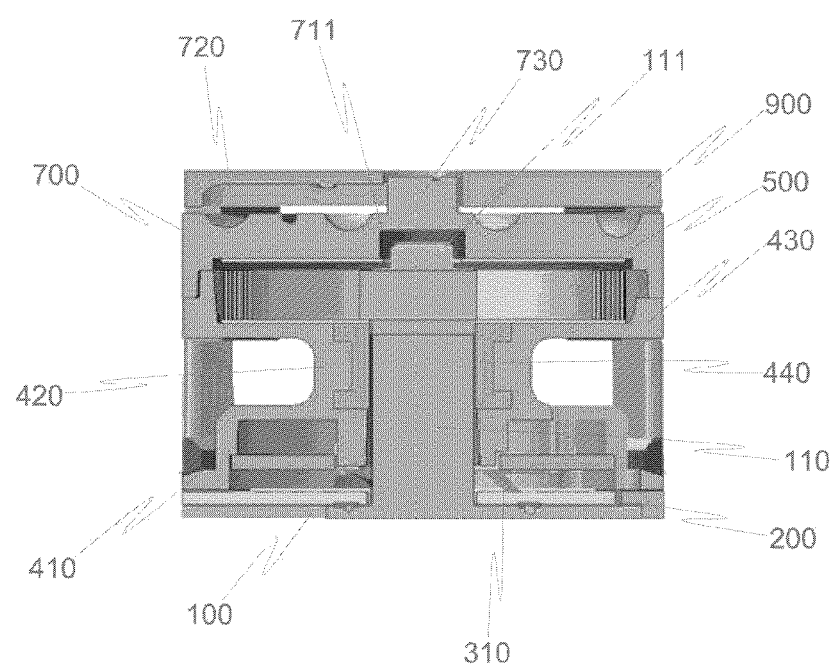
FIG. 5 is a cross-sectional view of the automatic rewinding apparatus in accordance with the embodiment of the present invention.

FIGS. 1 and 2 illustrate a usage example of a Bluetooth neck band-type ear phone to which an embodiment of the present invention is applied. FIG. 3 is a disassembled perspective view of an automatic rewinding apparatus in accordance with an embodiment of the present invention. FIG. 4 is an assembled perspective view of a part of the automatic rewinding apparatus in accordance with the embodiment of the present invention. FIG. 5 is a cross-sectional view of the automatic rewinding apparatus in accordance with the embodiment of the present invention.

Referring to FIGS. 3 to 5, the automatic rewinding apparatus in accordance with the embodiment of the present invention may largely include a main base lower housing 100, a Printed Circuit Board (PCB) substrate 200, a contact terminal coupling plate 300, a middle base coil housing 400, a rolling elastic member 500, a pair of grease cover plates 600, a cap 700, a stopper ball 800, and a main base upper housing 900.

The automatic rewinding apparatus may include the main base lower housing 100 that includes a cylindrical fixing axis 110 formed at the center of a first side of the main base lower housing 100 perpendicularly to the first side; the PCB substrate 200 that has a central portion punctured so that the PCB substrate 200 is penetrated by the cylindrical fixing axis 110 at the center of the PCB substrate 200 and combined with the first side of the main base lower housing 100, and includes a 4-pin PCB pattern 210 formed on a second side which is the other side of the PCB substrate 200 which is different from a first side contacting the main base lower housing 100; the contact terminal coupling plate 300 that includes a 4-pin contact terminal 310 combined on a first side and has a central portion punctured so that the contact terminal coupling plate 300 is penetrated by the cylindrical fixing axis 110 at the center of the contact terminal coupling plate 300 and, when the contact terminal coupling plate 300 is combined with the cylindrical fixing axis 110, the 4-pin contact terminal 310 contacts the 4-pin PCB pattern 210 of the PCB substrate 200; the middle base coil housing 400 which includes: a sub-base lower housing 410 that is formed in a shape of a cylindrical cover having a first side open, a cylindrical winding bobbin 420 that is formed at the center of a second side of the sub-base lower housing 410 and has a wire wound up on the external circumferential surface of the winding bobbin 420, a sub-base upper housing 430 that is formed on a second side of the winding bobbin 420 and has a second side of the sub-base upper housing 430 open, where the open side of the sub-base upper housing 430 is in opposite to the open side of the sub-base lower housing 410, and an abrasion-resistance improving insert 440 that is disposed in the internal circumferential surfaces of the punctured centers of the sub-base lower housing 410, the winding bobbin 420, the sub-base upper housing 430, and penetrated by and combined with the cylindrical fixing axis 110; the rolling elastic member 500 that is formed to have elasticity in a rolled form and housed in the inside of the sub-base upper housing 430 so as to provide the middle base coil housing 400 with a rotation force; a pair of the grease cover plates 600 that are formed in a disk shape, have a central portion punctured so that the pair of the grease cover plates 600 are penetrated by and combined with the cylindrical fixing axis 110, are combined with the cylindrical fixing axis 110 by being respectively disposed on both sides of the rolling elastic member 500, and prevent a grease applied to the rolling elastic member 500 from leaking by being housed in the inside of the sub-base upper housing 430; the cap 700 that has a first side which is formed in a cover shape to cover the opening of the sub-base upper housing 430 and to be combined with the sub-base upper housing 430, and a second side where a track 720 for moving a stopper ball is formed; the stopper ball 800 that is positioned on the track 720 and moves along the track 720 and; and the main base upper housing 900 that is formed to be combined with the main base lower housing 100 and to entirely cover the second side where the track 720 of the cap 700 is formed, when the main base upper housing 900 is combined with the main base lower housing 100.

The main base lower housing 100 may be formed in a plate shape, and include the cylindrical fixing axis 110 that is formed in a direction perpendicular to the first side.

The main base lower housing 100 may further include a plurality of combining grooves 120 that are disposed in a radial shape on the outskirt of the first side.

The PCB substrate 200 may be formed to be combined with the first side of the main base lower housing 100.

The central portion of the PCB substrate 200 may be punctured so that the central portion of the PCB substrate 200 is penetrated by and combined with the cylindrical fixing axis 110.

The PCB substrate 200 may be formed to include the 4-pin PCB pattern 210 on the second side which is a different from the first side that contacts the main base lower housing 100.

The contact terminal coupling plate 300 may include the 4-pin contact terminal 310 on the first side.

The central portion of the contact terminal coupling plate 300 may be punctured so that the central portion of the contact terminal coupling plate 300 may be penetrated by and combined with the cylindrical fixing axis 110.

The contact terminal coupling plate 300 may be formed to rotate based on the cylindrical fixing axis 110.

The contact terminal coupling plate 300 may be formed to have the 4-pin contact terminal 310 contact the 4-pin PCB pattern 210 of the PCB substrate 200, when the contact terminal coupling plate 300 is combined with the cylindrical fixing axis 110.

The middle base coil housing 400 may include the sub-base lower housing 410, the winding bobbin 420, and the sub-base upper housing 430.

The central portions of the constituent elements of the middle base coil housing 400 may be punctured individually so that the central portions of the constituent elements of the middle base coil housing 400 may be sequentially penetrated by and combined with the cylindrical fixing axis 110.

The middle base coil housing 400 may be formed to rotate based on the cylindrical fixing axis 110.

The middle base coil housing 400 may include the abrasion-resistance improving insert 440 on the internal circumferential surface of the punctured central portion.

The abrasion-resistance improving insert 440 may be formed of a metal according to an embodiment of the present invention.

The sub-base lower housing 410 may be formed in a shape of a cylindrical cover one side of which is open.

The central portion of the sub-base lower housing 410 may be punctured so that the central portion of the sub-base lower housing 410 may be penetrated by and combined with the cylindrical fixing axis 110.

The sub-base lower housing 410 may be formed to house the PCB substrate 200 and the contact terminal coupling plate 300 inside, when the sub-base lower housing 410 is combined with the cylindrical fixing axis 110.

The winding bobbin 420 may be formed in a cylindrical shape, and the winding bobbin 420 may be disposed at the center of the first side of the sub-base lower housing 410 to wind up a wire on its external circumferential surface.

The central portion of the winding bobbin 420 may be punctured so that the central portion of the winding bobbin 420 may be penetrated by and combined with the cylindrical fixing axis 110, when the cylindrical fixing axis 110 penetrates through the central portion of the sub-base lower housing 410.

The sub-base upper housing 430 may be formed on the second side of the winding bobbin 420, and the sub-base upper housing 430 may be formed in a cylindrical shape the second side of which is open. The second side of the sub-base upper housing 430 may be in opposite to the direction that the sub-base lower housing 410 is open based on the winding bobbin 420.

The central portion of the sub-base upper housing 430 may be punctured so that the central portion of the sub-base upper housing 430 may be sequentially penetrated by and combined with the cylindrical fixing axis 110 along with the sub-base lower housing 410 and the winding bobbin 420.

The sub-base upper housing 430 may be formed to have a housing space inside to house the rolling elastic member 500 and the grease cover plates 600.

In other words, the middle base coil housing 400 may have the sub-base lower housing 410 on the first side and the sub-base upper housing 430 on the second side with the winding bobbin 420 between the sub-base lower housing 410 and the sub-base upper housing 430. The first side of the middle base coil housing 400 may be combined with the sub-base lower housing 410 to be open toward the outside, and the second side of the middle base coil housing 400 may be combined with the sub-base upper housing 430 to be open toward the outside.

The rolling elastic member 500 may be formed to have elasticity in a rolled form.

The rolling elastic member 500 may be formed to be inserted into and connected to catching and coupling grooves 111 of the cylindrical fixing axis 110, after the cylindrical fixing axis 110 penetrates through and is combined with the middle base coil housing 400.

In other words, a first end of the rolling elastic member 500 disposed at the center may be combined with the cylindrical fixing axis 110 when the rolling elastic member 500 is rolled up, and a second end of the rolling elastic member 500 disposed on the outskirt may be combined with the sub-base upper housing 430. In this way, when the middle base coil housing 400 rotates based on the cylindrical fixing axis 110, the rolling elastic member 500 may provide the middle base coil housing 400 with elasticity and make the middle base coil housing 400 rewound in the opposite direction.

The rolling elastic member 500 may be formed to be housed in the inside of the sub-base upper housing 430 and to provide the middle base coil housing 400 with a rotation force.

The grease cover plates 600 may be formed in a shape of a disk.

The central portion of the grease cover plates 600 may be punctured so that the central portions of the grease cover plates 600 may be penetrated by and combined with the cylindrical fixing axis 110.

The grease cover plates 600 may be formed to rotate based on the cylindrical fixing axis 110.

The grease cover plates 600 may be formed in a pair, and when a pair of the grease cover plates 600 is combined with the cylindrical fixing axis 110, the grease cover plates 600 may be combined with the cylindrical fixing axis 110 while being respectively disposed on both sides of the rolling elastic member 500.

The grease cover plates 600 may be formed to prevent a grease applied to the rolling elastic member 500 from leaking out by being housed in the inside of the sub-base upper housing 430.

The first side of the cap 700 may be formed in a shape of a cover to cover the opening of the sub-base upper housing 430 and to be combined with the sub-base upper housing 430.

The cap 700 may include an inserting connection groove 711 at the center of the first side of the cap 700. The inserting connection groove 711 may be formed in the form of a concave groove, and one end of the catching and coupling grooves 111 may be inserted into the inserting connection groove 711.

The track 720 for moving a stopper ball may be formed on the second side of the cap 700.

The cap 700 may also include a rotation axis inserting protrusion 730 at the center of the second side.

The stopper ball 800 may be positioned on the track 720 so that the stopper ball 800 may roll over and move along the track 720.

The main base upper housing 900 may be formed to be combined with the main base lower housing 100.

When the main base upper housing 900 is combined with the main base lower housing 100, the main base upper housing 900 may be formed to cover the entire first side of the cap 700 where the track 720 is formed.

The main base upper housing 900 may include a rotation axis inserting groove 930 at the center of the first side of the main base upper housing 900. The rotation axis inserting groove 930 may be formed to be punctured or in the form of a concave groove. The rotation axis inserting protrusion 730 may be inserted into the rotation axis inserting groove 930.

The main base upper housing 900 may include a plurality of combining protrusions 920 on the outskirt of the first side. The combining protrusions 920 may be formed to be disposed in a radial shape to correspond to the positions where the combining grooves 120 of the main base lower housing 100 are disposed.

Figure 6:
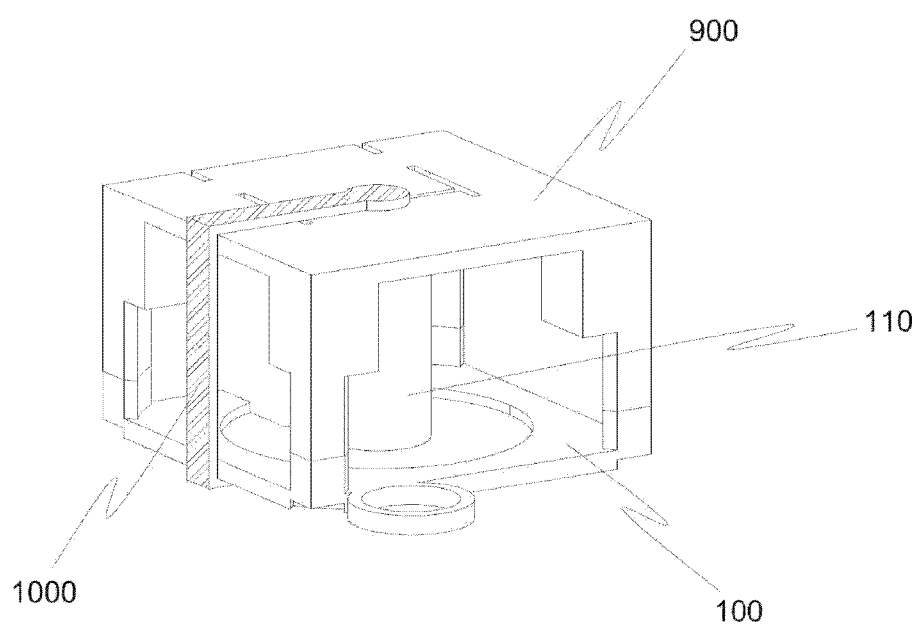
FIGS. 6 to 8 illustrate a main base lower housing 100 and a main base upper housing 900 of the automatic rewinding apparatus in accordance with the embodiment of the present invention.
Figure 7:
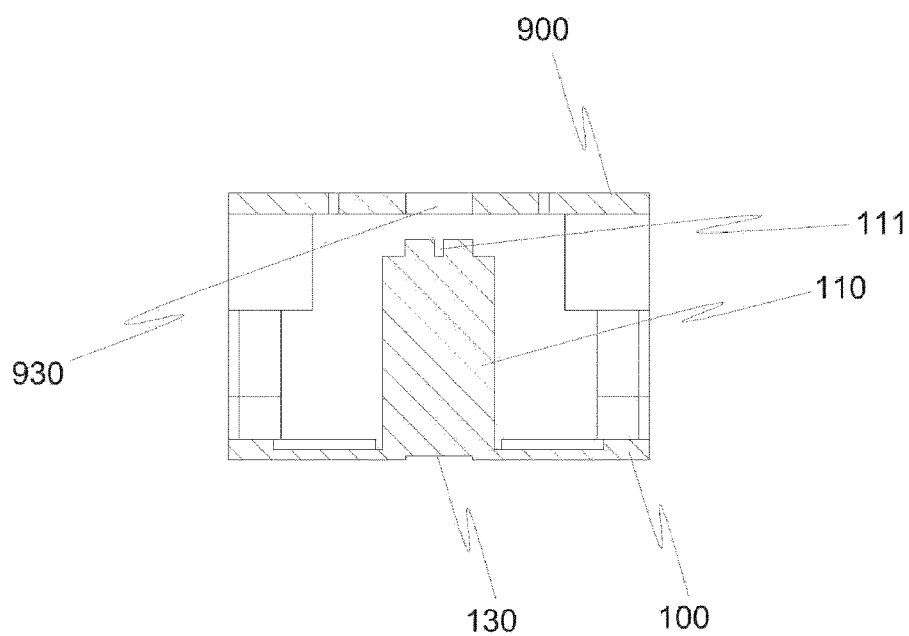
Figure 8:
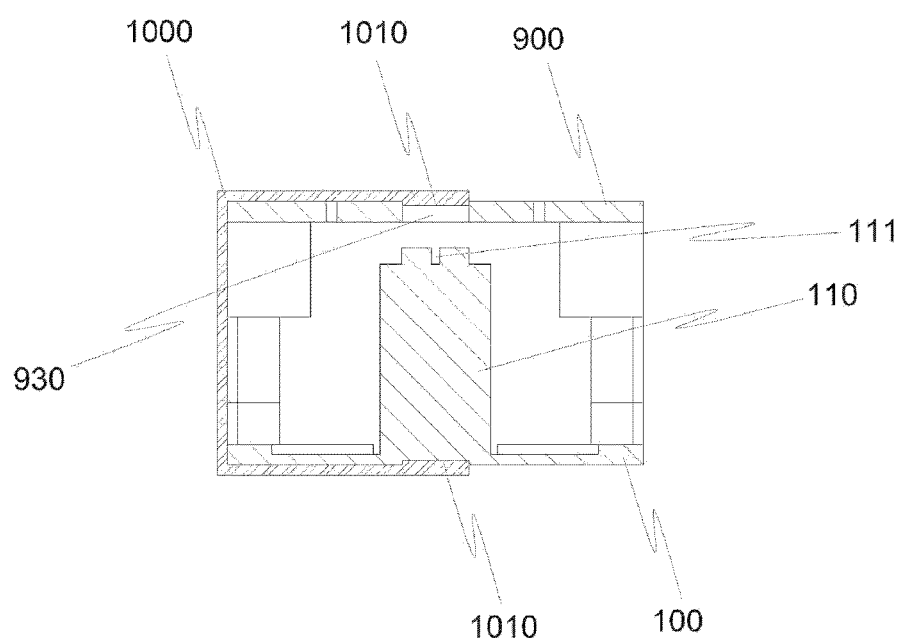

Referring to FIGS. 6 to 8, the main base lower housing 100 and the main base upper housing 900 may further include a rotation axis reinforcing clip 1000.

The rotation axis enhancing clip 1000 may further include a rotation axis enhancing protrusion 1010 that is formed to be protruded inward at an end.

The rotation axis enhancing protrusion 1010 may be inserted into and combined with the first side of the main base lower housing 100, or the rotation axis enhancing protrusion 1010 may be inserted into and combined with the rotation axis inserting groove 930 of the main base upper housing 900.

According to an embodiment of the present invention, as illustrated in FIG. 7, a rotation axis enhancing groove 130 may be formed in the form of a concave groove on the first side of the main base lower housing 100 that contacts the rotation axis enhancing protrusion 1010, and the rotation axis enhancing protrusion 1010 of the rotation axis enhancing clip 1000 may be inserted into and combined with the rotation axis enhancing groove 130, while the rotation axis enhancing protrusion 1010 of the rotation axis enhancing clip 1000 may be inserted into and combined with the rotation axis inserting groove 930 of the main base upper housing 900.

According to the embodiments of the present invention, an automatic rewinding apparatus may be able to maintain a rotation axis firmly without distortion even though the automatic rewinding apparatus is used for a long time so that the automatic rewinding apparatus may prevent disconnection between a terminal end and a Printed Circuit Board (PCB) pattern and prevent a short-circuit form occurring.

Also, according to the embodiments of the present invention, an automatic rewinding apparatus may be able to maintain a rotation axis firmly without distortion even though the automatic rewinding apparatus is used for a long time so that automatic rewinding function of the automatic rewinding apparatus may be prevented from malfunctioning due to a ball stuck in a track.

Also, according to the embodiments of the present invention, an automatic rewinding apparatus may be able to maintain a rotation axis firmly without distortion even though the automatic rewinding apparatus is used for a long time so that a 4-pin terminal and a PCB pattern for a 4-pin terminal, which require a rotation to be performed delicately and firmly, may be used stably without a short-circuit.

While the present invention has been described with respect to the specific embodiments, it will be apparent to those skilled in the art that various changes and modifications may be made without departing from the spirit and scope of the invention as defined in the following claims.

What is claimed is:

1. An automatic rewinding apparatus with an abrasion-resistant rotation axis, comprising:
   a main base lower housing that includes a cylindrical fixing axis formed at a center of a first side of the main base lower housing perpendicularly to the first side;
   a Printed Circuit Board (PCB) substrate that has a central portion punctured so that the PCB substrate is penetrated by the cylindrical fixing axis at a center of the PCB substrate and combined with the first side of the main base lower housing, and includes a 4-pin PCB pattern formed on a second side which is another side of the PCB substrate which is different from a first side contacting the main base lower housing;
   a contact terminal coupling plate that includes a 4-pin contact terminal combined on a first side and has a central portion punctured so that the contact terminal coupling plate is penetrated by the cylindrical fixing axis at a center of the contact terminal coupling plate and, when the contact terminal coupling plate is combined with the cylindrical fixing axis, the 4-pin contact terminal contacts the 4-pin PCB pattern of the PCB substrate;
   a middle base coil housing which includes:
      a sub-base lower housing that is formed in a shape of a cylindrical cover having a first side open,
      a cylindrical winding bobbin that is formed at a center of a second side of the sub-base lower housing and has a wire wound up on an external circumferential surface of the winding bobbin,
      a sub-base upper housing that is formed on a second side of the winding bobbin and has a second side of the sub-base upper housing open, where the open side of the sub-base upper housing is in opposite to the open side of the sub-base lower housing, and
      an abrasion-resistance improving insert that is disposed on internal circumferential surfaces of punctured centers of the sub-base lower housing, the winding bobbin and the sub-base upper housing, and penetrated by and combined with the cylindrical fixing axis;
   a rolling elastic member that is formed to have elasticity in a rolled form and housed inside the sub-base upper housing so as to provide the middle base coil housing with a rotation force;
   a pair of the grease cover plates that are formed in a disk shape, have a central portion punctured so that the pair of the grease cover plates are penetrated by and combined with the cylindrical fixing axis, are combined with the cylindrical fixing axis by being respectively disposed on both sides of the rolling elastic member, and prevent a grease applied to the rolling elastic member from leaking by being housed inside the sub-base upper housing;
   a cap that has a first side which is formed in a cover shape to cover the opening of the sub-base upper housing and to be combined with the sub-base upper housing, and a second side where a track for moving a stopper ball is formed;
   a stopper ball that is positioned on the track and moves along the track; and
   a main base upper housing that is formed to be combined with the main base lower housing and to entirely cover a second side where the track of the cap is formed when the main base upper housing is combined with the main base lower housing,
   wherein when the wire is unwound from the cylindrical winding bobbin to a length selected by an user, the rolling elastic member is rolled up so that the rotation force is increased, and the stopper ball moves along the track to a stopped position, and
   wherein when the wire is wound onto the cylindrical winding bobbin from the length selected by the user, the rolling elastic member is unrolled due to the release of the rotation force, and the stopper ball moves along the track to an unstopped position.

2. The automatic rewinding apparatus of claim 1, wherein the main base lower housing includes a plurality of combining grooves that are disposed in a radial shape on an outskirt of the first side.

3. The automatic rewinding apparatus of claim 1, wherein the main base upper housing includes a plurality of combining protrusions that are disposed in a radial shape on an outskirt of a first side.

4. The automatic rewinding apparatus of claim 1, wherein the abrasion-resistance improving insert is formed of a metal.

* * * * *